United States Patent [19]

Kellogg

[11] 4,206,416

[45] Jun. 3, 1980

[54] WIDEBAND INSTRUMENTATION AMPLIFIER WITH HIGH COMMON MODE REJECTION

[75] Inventor: James R. Kellogg, Portland, Oreg.

[73] Assignee: Tektronix, Inc., Beaverton, Oreg.

[21] Appl. No.: 910,171

[22] Filed: May 30, 1978

[51] Int. Cl.[2] .............................................. H03F 3/45
[52] U.S. Cl. .................................. 330/69; 330/258
[58] Field of Search .............................. 330/69, 258

[56] References Cited

U.S. PATENT DOCUMENTS

| | | | |
|---|---|---|---|
| 3,275,945 | 9/1966 | Walker et al. | 330/258 |
| 3,453,554 | 7/1969 | Shoemaker | 330/258 |
| 3,516,005 | 6/1970 | Brown | 330/69 |
| 3,582,802 | 6/1971 | Weekes | 330/258 |
| 3,761,831 | 9/1973 | Foerster | 330/69 |
| 4,086,541 | 4/1978 | Katow et al. | 330/65 X |

*Primary Examiner*—James B. Mullins
*Attorney, Agent, or Firm*—George T. Noe

[57] ABSTRACT

A high performance, wideband instrumentation amplifier includes a main differential amplifier channel which receives an input signal having both differential and common-mode signal components, and a compensation amplifier channel which effectively removes the common mode signal component.

5 Claims, 3 Drawing Figures

1

WIDEBAND INSTRUMENTATION AMPLIFIER WITH HIGH COMMON MODE REJECTION

BACKGROUND OF THE INVENTION

The present invention relates to high performance instrumentation differential amplifiers in general, and more particularly to such an amplifier having a compensation channel to effect high common mode signal rejection.

Differential amplifiers are well known in the art and are used in many applications in which it is desired to amplify only the differential signal component of input signals having both differential signal components and common mode signal components. Examples of such applications include instrumentation amplifiers, physiological monitors, vertical amplifiers in oscilloscopes, and other measurment amplifiers. In such amplifiers, one measure of accuracy is the degree to which the common mode signal component can be cancelled or rejected, and this is known as common-mode rejection (CMR).

Many schemes have been attempted to improve the common-mode rejection characteristic of true differential amplifiers, including the use of elaborate guard circuits, feedback networks, capacitively-coupled bootstrapping networks, and power-supply regulation schemes. Common mode rejection of $-120$ dB has been attained through the use of such complex and expensive techniques; however, such techniques invariably impose some limitation upon the circuit, such as reduced bandwidth or dynamic range, which must be taken into consideration as possible trade-offs in optimizing common mode rejection in the design of differential amplifiers.

SUMMARY OF THE INVENTION

In accordance with the present invention, a high performance differential amplifier exhibits high common mode rejection without any apparent adverse limitations imposed upon the amplifier. A main differential amplifier, which may suitably include a high-impedance differential input buffer stage, receives an input signal having both differential and common-mode signal components. A compensation amplifier channel having characteristics similar to the main amplifier channel is responsive to only the common mode signal component, effectively cancelling such common mode component from the circuit output signal. The compensation amplifier channel has no adverse effect on either differential gain, dynamic range, or the operating bandwidth.

It is therefore one object of the present invention to provide a novel high performance differential amplifier having high common mode rejection.

It is another object to provide a high performance differential amplifier including a compensation amplifier to effect high common mode rejection without adversely affecting either differential gain, dynamic range, or operating bandwidth.

It is a further object to provide a high performance differential amplifier having high common mode rejection, which amplifier may be constructed simply and inexpensively.

Other objects and attainments of the present invention will become apparent to those skilled in the art upon a reading of the following detailed description when taken in conjunction with the drawings.

DRAWINGS

DETAILED DESCRIPTION OF THE DRAWINGS

Figure 1:
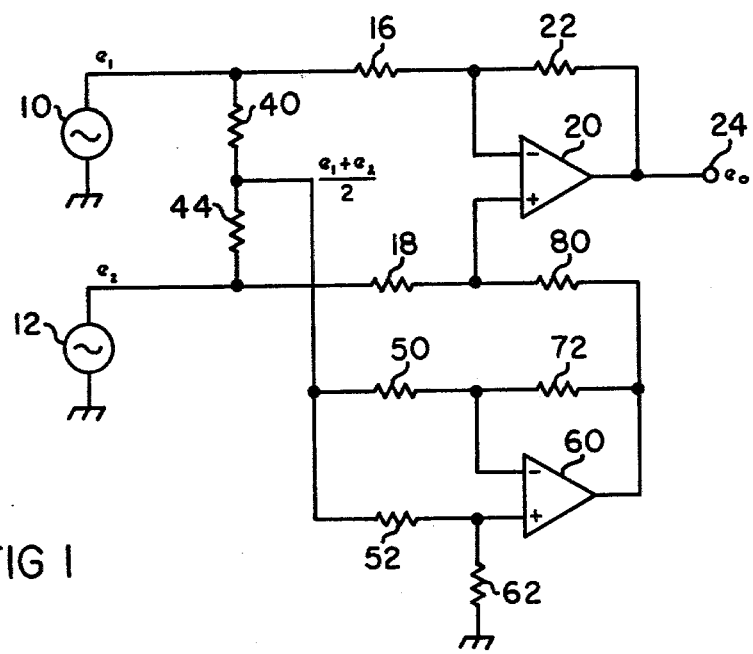
FIG. 1 is a schematic diagram of a basic DC-coupled differential amplifier including a compensation amplifier in accordance with the present invention.

Turning now to the drawings, there is shown in FIG. 1 the basic D.C. coupled differential amplifier including a compensation amplifier to increase the common mode rejection in accordance with the present invention. A pair of signal generators 10 and 12 produce electrical signals $e_1$ and $e_2$ respectively, which signals are applied through equal-valued resistors 16 and 18 to the inverting (negative) and noninverting (positive) inputs respectively of an operational amplifier 20. Gain-setting resistor 22 provides feedback from the operational amplifier to the negative input thereof, and an output signal $e_0$ is available at output terminal 24.

The circuit thus far described is a conventional DC coupled differential amplifier for which the output signal $e_0$ may be described mathematically as $[(e_1-e_2)(-A_d)]+[\frac{1}{2}(e_1+e_2)(A_{cm})]$ where $A_d$ is the differential gain and $A_{cm}$ is the common mode gain.

A serially-connected pair of equal-valued resistors 40 and 44 are connected across the input lines between signal generators 10 and 12 to pick off the common-mode component $\frac{1}{2}(e_1+e_2)$ of the input signal. The common mode component is applied via equal-valued resistors 50 and 52 to the negative and positive inputs of an operational amplifier 60. The values of resistors 40, 44, 50, and 52 are chosen such that the Thevenin equivalent thereof is equal to the values selected for resistors 16 and 18. Thus, it is intended that operational amplifers 20 and 60 preferably see the same common-mode signal at the inputs thereof. Resistors 50 and 52 are closely matched so that no differential signal component is developed across the inputs of amplifier 60. The positive input of amplifier 60 is referred to ground reference through a resistor 62. The output is fed back to the negative input of the amplifier 60 through a resistor 72, which is equal in value to resistor 62. Further, the output of amplifier 60 is connected through a resistor 80 to the positive input amplifier 20. With the input resistors having equivalent values as described hereinabove, resistors 22, 62, 72, and 80 may suitably be of equal value so that the common-mode signal currents generated in these resistors as a result of the common mode response of amplifiers 20 and 60 are equal.

The operation of the circuit is such that a common mode signal current is generated in resistor 80 to match the common mode signal current flowing in resistor 22. Since these currents are applied to the opposite inputs of amplifier 20, the common-mode signal component is effectively cancelled from the output signal $e_0$. The output signal may be expressed mathematically as $e_0 = -[(e_1+e_2)(-A_d)]+[\frac{1}{2}(e_1+e_2)(A_{cm})]-[0(-A_d)]-[\frac{1}{2}(e_1+e_2)(A_{cm})]$, which reduces to simply $e_0 = (e_1+e_2)(-A_d)$.

The degree of cancellation, or common mode rejection, depends upon the matching of the components and the common mode gain $A_{cm}$ of the amplifiers. For example, where the common mode rejection of operational amplifier 20 may be −80 dB by itself, an overall common mode rejection of up to −140 dB may be attained by the utilization of closely matched amplifiers and resistors.

Figure 2:
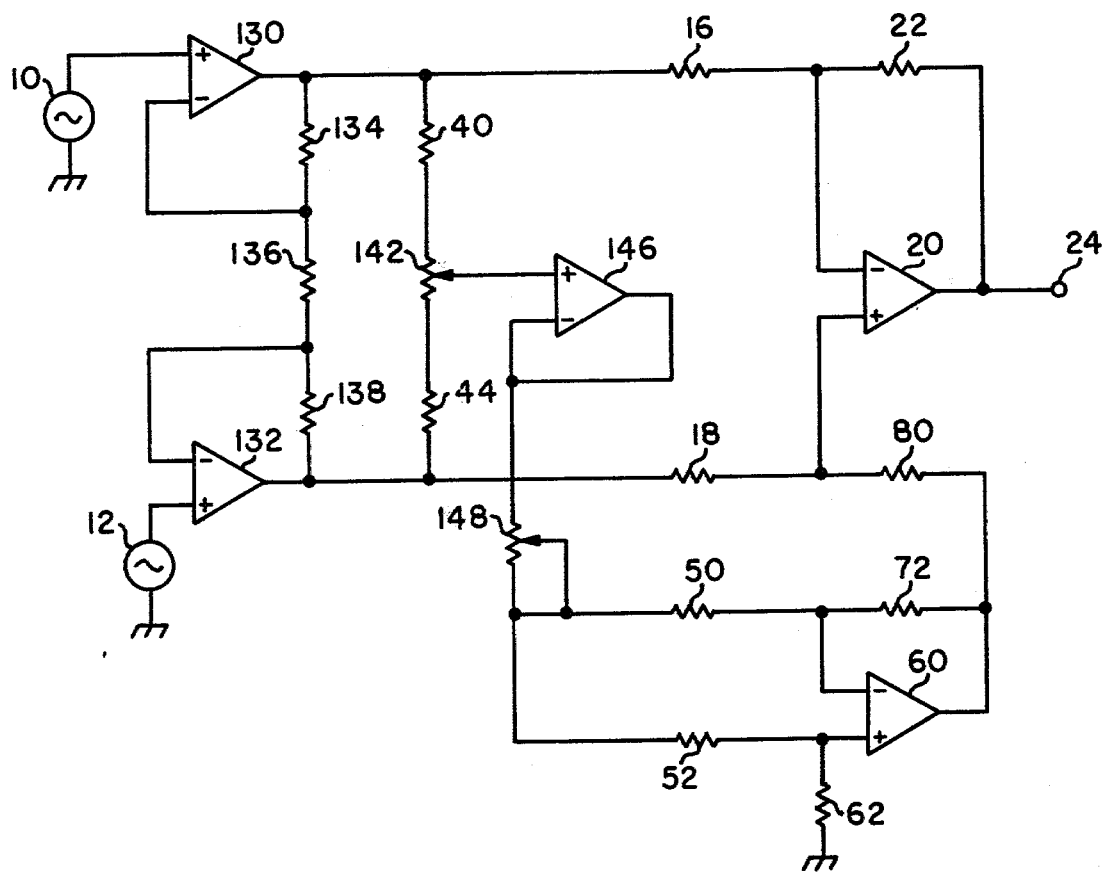
FIG. 2 is a schematic diagram of one embodiment of a high performance differential amplifier circuit.

FIG. 2 shows one embodiment of an amplifier in accordance with the present invention. Components which are substantially the same as those described hereinabove in connection with FIG. 1 have retained the same reference numerals to facilitate understanding of the circuit.

Amplifiers 130 and 132, and associated resistors 134, 136, and 138 have been added to the circuit to provide both a high input impedance buffer stage and a first stage of differential amplification. These are essentially non-inverting operational amplifiers, the gain of which is determined by resistors 134, 136, and 138.

A potentiometer 142 has been interposed between resistors 40 and 44, the wiper arm of which is connected to the positive input of amplifier 146. Amplifier 146 is connected as a unity-gain voltage follower. The output of amplifier 146 is adjusted by potentiometer 142 precisely to the electrical center between the outputs of amplifiers 130 and 132.

A variable resistor 148 may be interposed between the output of amplifier 146 and the junction of resistors 50 and 52 to provide a precise match of common mode gain $A_{cm}$ between amplifiers 20 and 60.

Figure 3:
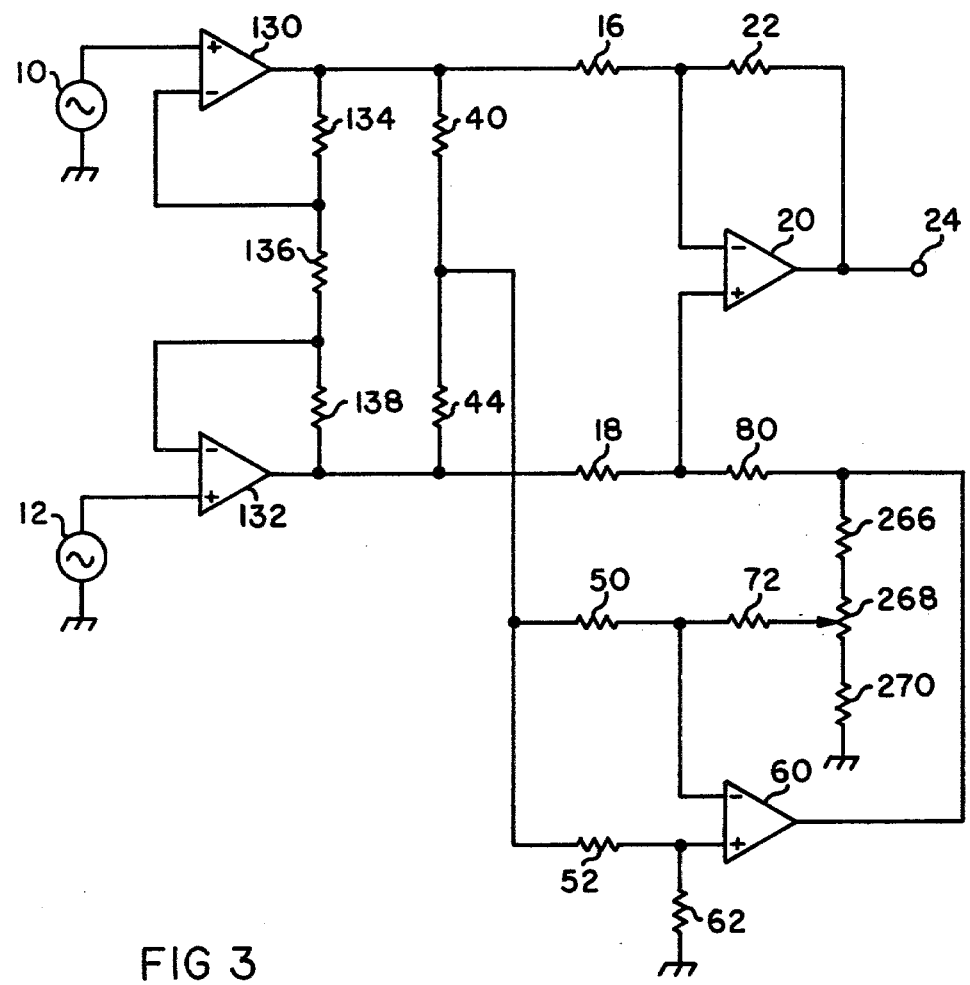
FIG. 3 is a schematic diagram of a preferred embodiment of a high performance differential amplifier in accordance with the present invention.

FIG. 3 shows a preferred embodiment of an amplifier in accordance with the present invention. Components which are substantially the same as those described hereinabove in connection with FIGS. 1 and 2 have retained the same reference numerals to facilitate understanding of the circuit without repeating already-described circuits. This embodiment employs the input buffer differential amplifier stage comprising amplifiers 130 and 132 as described in connection with FIG. 2, with the remaining circuit similar to FIG. 1. Rather than a single fixed feedback resistor 72 connected around amplifier 60, a voltage divider comprising resistors 266, 268, and 270 is connected between the amplifier 60 output and ground to divide the feedback down to the point at which common mode gain $A_{cm}$ of amplifier 60 is balanced with that of amplifier 20. In the FIG. 1 circuit, imbalance of $A_{cm}$ between the amplifiers requires that the ratio of input and feedback resistances of amplifier 60 be chosen accordingly. The FIG. 3 arrangement permits the input and feedback resistors of both amplifiers 20 and 60 to be substantially the same, with resistor 268 providing the fine-tune adjustment to balance the amplifiers.

In the foregoing circuits, the differential gain $A_d$ and dynamic characteristics of amplifier 20 have no limitations imposed thereon as a result of the compensation amplifier 60 being added into the circuit, thus these parameters remain unchanged and are therefore predictable. The high common-mode rejection, e.g., −120 dB to −160 dB, is effective within the bandwidth over which the common-mode responses of the two amplifiers track.

Input offset voltages and offset temperature coefficients will tend to cancel to the extent that they are matched and track. Independent of common-mode response tracking between the amplifiers, small DC mismatches and imbalance due to resistor tolerances can be removed with a single adjustment of resistor 268, or in the case of hybrid or monolithic integrated circuit structures, resistor 268 may be laser trimmed using active trim techniques. In addition, signal path lengths may be matched for both the differential amplifier and compensation amplifier channels so that propagation delays and phase-shifting propensities may be matched over a sufficient bandwidth, which may be DC to several megahertz, to take advantage of the entire bandwidth over which the common-mode responses of the two amplifiers track.

The circuits may be fabricated in monolithic integrated-circuit form, hybrid form, or of discrete components, and yet exhibit high performance qualities. In discrete form, the operational amplifiers themselves may be commercially available integrated-circuit packages, either singles or duals; however, it should be realized that the more care taken in fabricating the amplifier, the better the performance that may be expected. For example, a circuit similar to that of FIG. 2 has been constructed and bench tested utilizing unmatched, inexpensive operational amplifiers and 0.25% resistors. The measured common mode rejection with amplifier 146 disconnected was −77 dB; with amplifier 146 connected and resistors 142 and 148 properly adjusted, the measured common mode rejection was −126 dB. With tighter resistor tolerances and matched operational amplifiers, an improvement of 60 dB or more may be possible.

While there have been shown and described several embodiments of the present invention, it will be apparent to those skilled in the art that many changes and modifications may be made without departing from the invention in its broader aspects. It is therefore contemplated that the appended claims will not be construed in a limiting sense and will cover any such modifications or embodiments as fall within the true scope of the invention.

What I claim as being novel is:

1. A high performance instrumentation amplifier, comprising:
    a pair of input terminals and an output terminal;
    a first operational amplifier having inverting and non-inverting inputs DC coupled to said pair of input terminals, an output coupled to said output terminal, and a feedback resistor coupled from said first operational amplifier output to the inverting input thereof;
    a second operational amplifier having inverting and non-inverting inputs, an output, and a feedback resistor coupled from said second operational amplifier output to the inverting input thereof, said second operational amplifier having substantially the same gain characteristics and common-mode response as said first operational amplifier;
    means coupled to said input terminals for deriving a common-mode signal from an input signal and applying said common-mode signal to both of said inverting and non-inverting inputs of said second operational amplifier; and
    means for DC coupling the output of said second operational amplifier to the non-inverting input of said first operational amplifier to provide a common-mode cancellation signal thereto.

2. An amplifier in accordance with claim 1 wherein said common-mode signal deriving means comprises a resistive network serially coupled between said input terminals and a pair of equal-valued resistors coupled to the electrical center of said resistor network, the opposite ends of said equal-valued resistors being coupled respectively to the inverting and non-inverting inputs of said second operational amplifier.

3. An amplifier in accordance with claim 2 further including a buffer amplifier disposed between said electrical center of said resistive network and said pair of equal-valued resistors.

4. An amplifier in accordance with claim 1 wherein said common-mode cancellation signal DC coupling means comprises a resistor having substantially the same resistance value as the feedback resistor of said first operational amplifier.

5. An amplifier in accordance with claim 1 further including a differential buffer amplifier interposed between said input terminals and said common-mode signal deriving means.

* * * * *